United States Patent
Riva

(10) Patent No.: US 6,788,517 B2
(45) Date of Patent: Sep. 7, 2004

(54) CONDUCTION LINE DECOUPLING CIRCUIT

(75) Inventor: Marco Riva, Lallio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 435 days.

(21) Appl. No.: 09/917,613

(22) Filed: Jul. 26, 2001

(65) Prior Publication Data

US 2002/0033726 A1 Mar. 21, 2002

(30) Foreign Application Priority Data

Jul. 27, 2000 (IT) ...................................... MI2000A1729

(51) Int. Cl.⁷ ................................................ H02H 3/22
(52) U.S. Cl. ........................ 361/111; 327/310; 326/86
(58) Field of Search ............................. 361/111; 326/86, 326/87; 327/309, 310, 312, 318, 321, 322, 327, 545, 537

(56) References Cited

U.S. PATENT DOCUMENTS

| | | | | |
|---|---|---|---|---|
| 5,191,244 A | * | 3/1993 | Runaldue et al. | ............. 326/86 |
| 6,020,779 A | * | 2/2000 | Udo | ........................... 327/537 |
| 6,184,703 B1 | * | 2/2001 | Vest et al. | .................... 326/86 |

* cited by examiner

*Primary Examiner*—Jessica Han
(74) *Attorney, Agent, or Firm*—Lisa K. Jorgenson; E. Russell Tarleton; Seed IP Law Group PLLC

(57) ABSTRACT

A decoupling circuit for decoupling conduction lines from each other, the circuit including at least one pass gate element having conduction terminals connected to the conduction lines and having at least one control terminal. The decoupling circuit includes at least one protection circuit inserted between the control terminal and at least one of the conduction lines, and including at least one protection transistor connected to the control terminal and to the at least one conduction line, and configured to take in a disturbing signal passing through the pass gate element (N1) to properly decouple the conduction lines from each other on the occurrence of a disturbing condition.

20 Claims, 1 Drawing Sheet

CONDUCTION LINE DECOUPLING CIRCUIT

BACKGROUND OF THE INVENTION

1. Field of the Invention

The present invention relates to a circuit for decoupling conduction lines from each other. More specifically, the invention relates to a circuit for decoupling conduction lines from each other, which circuit includes at least one pass gate element having conduction terminals connected to the conduction lines and having at least one control terminal.

2. Description of the Art

As it is well known, two conduction lines of an electronic circuit are normally connected together through a decoupling circuit 10 as shown in FIG. 1 that comprises essentially a pass gate element.

In particular, the decoupling circuit 10 includes a pass gate decoupling transistor operative to connect the lines to each other allowing a signal to go through when in the 'on' state. It is operative to isolate the lines from each other and prevent the signal from going through when in the 'off' state.

As shown schematically in FIG. 1, first L1 and second L2 conduction lines are connected to each other through a pass gate decoupling circuit 10, essentially comprising a decoupling transistor N1.

The decoupling transistor N1 has its conduction terminals respectively connected to said conduction lines L1 and L2, and has a control or gate terminal connected to an input inverter I1. The decoupling transistor N1 may be a pass gate MOS transistor of the N or the P type, for example.

It should be noted that, for example when enhancement transistors are used, the decoupling condition of the conduction lines L1 and L2 (transistor 'off') is obtained by equalizing the gate terminal voltage and the bulk terminal voltage.

In this way, so long as the voltage signals presented on the two conduction lines L1 and L2 connected to the conduction terminals are above a ground reference level GND for an N-type decoupling transistor N1, or below a supply level Vdd for a P-type decoupling transistor, as it is usually happens the case in most circuits, the decoupling transistor N1 will actually be 'off' and the conduction lines L1, L2 properly decoupled.

On the other hand, if the voltage signals at the conduction terminals lie outside the above ranges, i.e., are below the ground reference level GND for an N-type decoupling transistor N1, or above the supply level Vdd for a P-type decoupling transistor, the decoupling transistor N1 might fail to go 'off', and the conduction lines L1, L2 might become improperly coupled.

Such abnormal operating condition are commonly known as disturbed conditions, and the voltage or current signals that originate them will be referred to as disturbing signals hereinafter.

In particular, in the instance of an enhancement decoupling transistor N1 of the N type, having its bulk terminal and gate terminal connected to a ground reference GND and, accordingly, being in a closed channel condition, the decoupling transistor N1 is turned off when the voltages at the conduction terminals are positive voltages.

In the event of one of the conduction terminals, e.g., the drain terminal, being at a lower voltage than the ground reference voltage GND, the voltage Vgs between the further conduction terminal, e.g., the source terminal, and the gate terminal might exceed the threshold voltage of the transistor, so that the latter shows out to be inexpediently on.

Thus, under the conditions outlined hereinabove, a decoupling transistor N1 of the N type is ineffective for the purpose of isolating the two conduction lines L1 and L2 from each other, and would rather allow an objectionable signal through.

This is congruously true for a P-type transistor, whenever the voltage at one of its conduction, source or drain terminals, is higher than the supply reference Vdd used here for biasing its bulk and gate terminals.

The particular instance of an N-type pass gate transistor will be considered hereinafter, it being understood that the same considerations are also true for a P-type transistor, where the terms are consistently substituted with their duals (transistor Nch<--> transistor Pch, reference GND <--> reference Vdd, higher than <--> lower than, etc.), as it is obvious to a skilled person in the art.

The aforementioned disturbing signals appear in various operating condition of electronic circuits, as exemplified here below:

1) Inside a generic electronic circuit:
   a. when two internal circuit nodes have different internal ground references (Vcc), because of resistances internal of the electronic circuit; and
   b. when a floating node is driven by capacitive effect.
2) In an I/O interface circuit on nodes that are connected to pads external of the electronic circuit:
   a. when voltage undershoots or overshoots occur because of inductive effects; and
   b. when outside of the I/O interface circuit a signal below the ground reference (or likewise, above the supply reference Vdd) is.

Electrostatic discharges (ESD) will not further be taken into account because the circuitry is assumed to incorporate adequate ESD protection structures.

The underlying technical problem addressed by the disclosed embodiments of this invention is to provide satisfactory isolation between conduction lines that are interconnected by a pass gate element, despite the presence of a disturbing signal on the lines, so as to avoid the malfunction condition of prior circuits.

SUMMARY OF THE INVENTION

The principle on which the embodiments of this invention stand is the one of connecting, in a circuit for decoupling conduction lines that are interconnected through a pass gate element, a protection circuit suitable to avoid the propagation of a disturbing signal over the lines, so as to provide the right turn-off condition for the pass gate element, meaning the right isolation condition of the conduction lines.

Based on the above principle, the technical problem is solved by a decoupling circuit for decoupling conduction lines from each other, the circuit having at least pass one gate element with conduction terminals connected to the conduction lines and at least one control terminal; and at least one protection circuit inserted between the control terminal and the at least one conduction line, the protection circuit including at least one protection transistor connected to the control terminal and to the at least one of the conduction lines and configured to take in any disturbing signal passing through the pass gate element to properly decouple the conduction lines from each other on the occurrence of a disturbing condition resulting from the disturbing signal.

In accordance with another aspect of the invention, a decoupling circuit is provided that has a decoupling transistor with first and second conduction terminals connected to first and second conduction lines, and a control terminal coupled to an inverter, and a protection circuit coupled to the inverter and the second conduction line, the protection circuit including a pull-up transistor having a first terminal coupled to a voltage source and a second terminal coupled to the second conduction line via a second decoupling transistor, and a control terminal coupled to the inverter, the second decoupling transistor having a first terminal coupled to the second terminal of the pull up transistor, a second terminal coupled to the second conduction line, and a control terminal coupled to the inverter.

In accordance with yet another aspect of the present invention, a decoupling circuit is provided that includes a decoupling transistor having first and second conduction terminals coupled to first and second conduction lines, respectively, a control terminal coupled to the output of an inverter, and a protection circuit comprising a protection transistor having a first conduction terminal coupled to the first conduction line, a second conduction terminal coupled to the output of the inverter, and a control terminal coupled to a ground reference potential.

In accordance with yet a further aspect of the present invention, a decoupling circuit is provided that includes a decoupling transistor having first and second conduction terminals coupled to first and second conduction lines, respectively, and a control terminal coupled to the output of an inverter, and further including a first protection circuit coupled between the second conduction line and the decoupling transistor and further coupled to the output of the inverter, and a second protection circuit coupled to the first conduction line and to the output of the inverter, the first and second protection circuits configured as described above.

BRIEF DESCRIPTION OF THE DRAWINGS

The features and advantages of a decoupling circuit according to the invention will be apparent from the following description of embodiments thereof, given by way of nonlimitative examples with reference to the accompanying drawings, wherein.

DETAILED DESCRIPTION OF THE INVENTION

Figure 1:
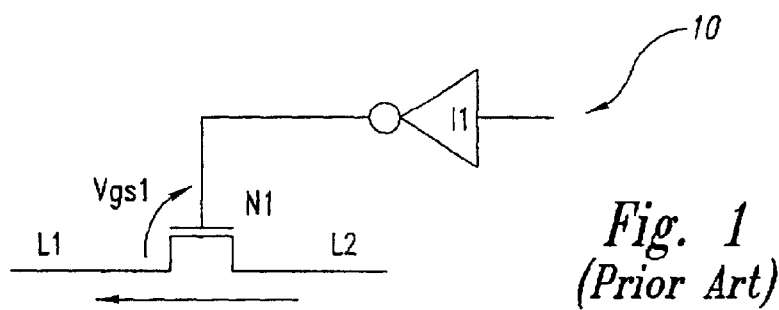
FIG. 1 schematically shows a conduction line decoupling circuit according to the prior art.
Figure 2:
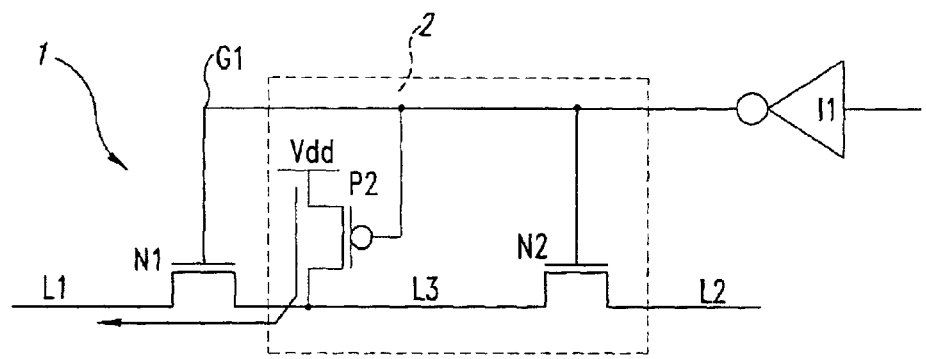
FIG. 2 schematically shows a first embodiment of a conduction line decoupling circuit according to the invention.

Shown in FIG. 2 of the drawings is a first embodiment of a decoupling circuit 1 for decoupling conduction lines L1 and L2 from each other, according to the invention. Advantageously in this invention, this decoupling circuit incorporates a protection circuit, generally shown at 2 in schematic form.

The decoupling circuit 1 basically comprises, and in a similar way as the aforementioned prior art, a decoupling transistor N1 connected between a first L1 and a second L2 conduction lines.

In particular, the decoupling transistor N1 has its conduction terminals respectively connected to said conduction lines L1 and L2, and has a gate or control terminal G1 connected to an input inverter I1. The decoupling transistor N1 may be a pass gate transistor of the N type, for example.

Advantageously in this invention, a protection circuit 2 is connected between the gate terminal G1 of the decoupling transistor N1 and at least one conduction line, in particular the second conduction line L2, and is connected to said input inverter I1.

In particular, the protection circuit 2 comprises a first protection transistor P2, being connected between a supply voltage reference Vdd and an internal conduction line L3 and having its gate terminal connected to the gate terminal G1 of the decoupling transistor N1.

The protection circuit 2 further comprises a second protection transistor N2 having its conduction terminals connected to said second conduction line L2 and to said internal conduction line L3, and having a gate terminal connected to the gate terminal G1 of the decoupling transistor N1.

The first protection transistor P2 is a PMOS transistor, whereas the second protection transistor N2 is an NMOS transistor. Thus, the protection circuit 2 has the MOS transistor P2 in a pull-up configuration and the MOS transistor N2 in a pass-gate configuration.

The operation of the decoupling circuit 1 incorporating the protection circuit 2 of this invention will now be described.

When the output of the input inverter I1 is grounded, the internal conduction line L3 is held high by the first protection transistor P2, and any disturbing current going through the decoupling transistor N1 would be bypassed from the supply voltage reference Vdd by the first protection transistor P2 rather than going directly through the second conduction line L2.

The protection circuit 2 is effective in that a disturbing current can be picked up by the PMOS transistor, harmlessly to this transistor, or as far as the current at stake does not affect the supply voltage Vdd to any significant extent.

This holds true if the disturbing current is temporary, or is not too large, this condition being dependent on the characteristics of the circuitry connected to the conduction lines L1 and L2.

Briefly, the protection circuit 2 will take in a disturbing signal passing through the decoupling transistor N1 and prevent it from propagating to the second conduction line L2.

Alternatively, a disturbing signal, especially a voltage signal, could be avoided by driving the gate terminal of the decoupling transistor N1 with a voltage below the voltage level present at the bulk terminal (and equal to the ground reference GND), such that it approaches or equals the disturbing voltage. However, this driving voltage is not generally available in conventional integrated circuits because it falls outside standard ranges of supply voltages.

Figure 3:
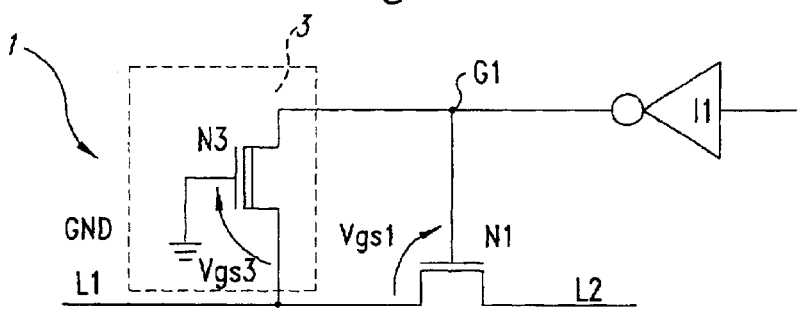
FIG. 3 schematically shows a second embodiment of a conduction line decoupling circuit according to the invention.

FIG. 3 shows a second embodiment of a decoupling circuit 1 incorporating a protection circuit 3 according to the invention.

Advantageously in this invention, the protection circuit 3 is connected between the gate terminal G1 of the decoupling transistor N1 and at least one conduction line, in particular the first conduction line L1.

The protection circuit 3 comprises a protection transistor N3 having its conduction terminals connected to the gate terminal G1 of the decoupling transistor N1 and to said first conduction line L1, and having its gate terminal connected to a ground reference GND.

The protection transistor N3 has its source terminal connected to the first conduction line L1, where a disturbing signal (especially a voltage signal) would appear, and has its drain terminal connected to the gate terminal G1 of the decoupling transistor N1.

Advantageously in this invention, the protection transistor N3 is a native NMOS transistor.

The operation of the decoupling circuit 1 incorporating the protection circuit 3 of this invention will now be described.

The protection circuit 3 holds the decoupling transistor N1 in the 'off' state by driving the voltage to its gate terminal G1 with a lower voltage than the ground reference GND. However, the protection circuit 3 does not require other voltage levels than the ground reference GND, and utilizes the disturbance-causing voltages as useful signals to drive the gate terminal G1 of the decoupling transistor N1.

Advantageously in this invention, the protection transistor N3 is of the native type, having a lower threshold voltage than the decoupling transistor N1.

The protection transistor N3, when in the 'on' state, connects the gate terminal G1 of the decoupling transistor N1 to the first conduction line L1.

In normal conditions, i.e., with the voltage on the first conduction line L1 higher than the ground reference value GND, the protection transistor N3 would be 'off' and the decoupling transistor N1 driven directly from the input inverter I1.

As the voltage on the first conduction line L1 drops below the ground reference value GND, the protection transistor N3, having its gate terminal grounded, tends to enter the 'on' state because its gate-source voltage Vgs3 increases as the voltage on the first conduction line L1 decreases.

When the protection transistor N3 turns on, the current flowing through it tends to depress the voltage at the gate terminal G1 of the decoupling transistor N1.

Thus, the voltage at the gate terminal G1 follows the source terminal voltage, maintaining the gate-source voltage Vgs1 of the decoupling transistor N1 constant.

By having a lower threshold voltage Vth3 than a threshold voltage Vth1 of the decoupling transistor N1, the protection transistor N3 turns on before the gate-source voltage Vgs1 exceeds the threshold voltage Vth1 of the decoupling transistor N1.

Thus, the decoupling transistor N1 is held 'off' and prevents a disturbing signal to pass on to the conduction lines L1 and L2.

Figure 4:
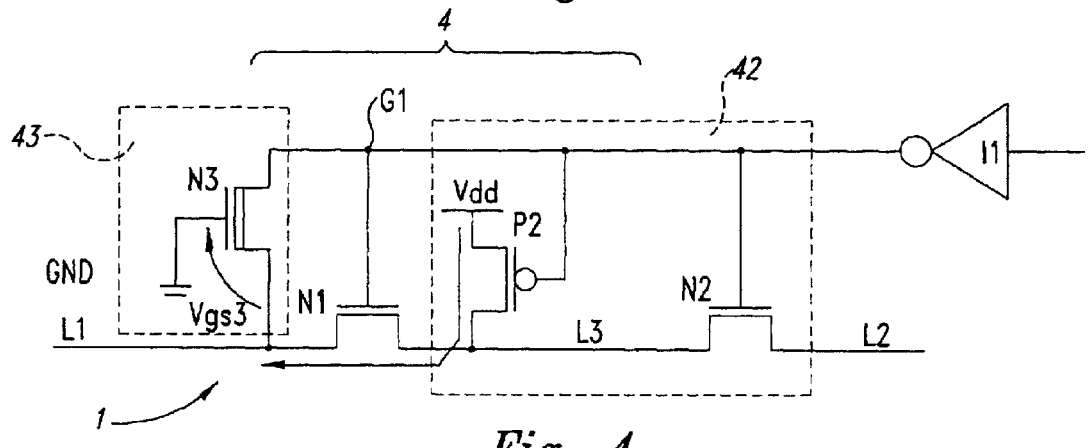
FIG. 4 schematically shows a third embodiment of a conduction line decoupling circuit according to the invention.

FIG. 4 shows a third embodiment of a decoupling circuit 1 incorporating a protection circuit 4 according to the invention.

Advantageously in this invention, the protection circuit 4 has a first portion 42, which is connected between the gate terminal G1 of the decoupling transistor N1 and at least one conduction line, in particular the second line L2, and connected to said input inverter I1. The protection circuit also has a second portion 43 connected between the gate terminal G1 of the decoupling transistor N1 and at least another conduction line, in particular the first line L1.

Similar as in the first embodiment, the first portion 42 comprises a first protection transistor P2, which is inserted between a supply voltage reference Vdd and an internal conduction line L3, and has its gate terminal connected to the gate terminal G1 of the decoupling transistor N1.

The first portion 42 further comprises a second protection transistor N2 having its conduction terminals connected to said second conduction line L2 and said internal conduction line L3, and having a gate terminal connected to the gate terminal G1 of the decoupling transistor N1.

Similar as in the second embodiment, moreover, the second portion 43 comprises a protection transistor N3 having its conduction terminals connected to the gate terminal G1 and to said first conduction line L1, and having its gate terminal connected to a ground reference GND.

Advantageously in this invention, the second protection transistor N2 in the first portion 42 has a threshold voltage value equal to the value of the threshold voltage Vth1 of the decoupling transistor N1.

In this case, with the protection transistor N3 of the second portion 43 turned on, the gate-source voltage Vgs1 of the decoupling transistor N1 is held almost constant and close to the value of the transistor threshold voltage Vth1.

Accordingly, the decoupling transistor N1 is highly resistive rather than truly 'off', and the current flowing through the first protection transistor P1 in the first portion 42 is much smaller than the current through the protection circuit 2 of FIG. 2.

Finally, it should be noted that disturbing signals, specifically voltage signals, are natively limited by the junction diode of the decoupling transistor N1 being forward biased and preventing a disturbing voltage from exceeding the junction built-in voltage by any significant amount.

Summarizing, this decoupling circuit prevents possible disturbing signals produced by voltages lying out of the normal supply and ground reference ranges from causing pass gate elements to be turned on to whose nodes, connected to conduction lines, the out-of-range voltages are applied.

From the foregoing it will be appreciated that, although specific embodiments of the invention have been described herein for purposes of illustration, various modifications may be made without deviating from the spirit and scope of the invention. Accordingly, the invention is not limited except as by the appended claims and the equivalents thereof.

What is claimed is:

1. A decoupling circuit for decoupling conduction lines from each other, the circuit comprising at least one pass gate element having conduction terminals connected to said conduction lines, and having at least one control terminal; and at least one protection circuit inserted between said control terminal and at least one of said conduction lines, said protection circuit comprising at least one protection transistor connected to said control terminal and said at least one of said conduction lines and configured to take in a disturbing signal passing through said pass gate element to properly decouple said conduction lines from each other.

2. The decoupling circuit of claim 1, wherein said protection circuit comprises at least one protection transistor inserted between a supply voltage reference and an internal conduction line and having a control terminal connected to the control terminal of said pass gate element.

3. The decoupling circuit of claim 2, wherein said protection circuit comprises another protection transistor having its conduction terminals connected to said at least one conduction line and to said internal conduction line and having a control terminal connected to the control terminal of said pass gate element.

4. The decoupling circuit of claim 3, wherein said protection transistor is a PMOS transistor in a pull-up configuration and said another protection transistor is an NMOS transistor in a pass-gate configuration.

5. The decoupling circuit of claim 1, wherein said protection circuit comprises at least one protection transistor having conduction terminals connected to the control terminal of said pass gate element and connected to said at least one conduction line and having a control terminal connected to a ground reference.

6. The decoupling circuit of claim 5, wherein said protection transistor is an NMOS transistor having a lower threshold voltage than a threshold voltage of said pass gate element.

7. The decoupling circuit of claim 1, wherein said protection circuit comprises at least a first portion connected between the control terminal of said pass gate element and at least one conduction line and at least a second portion inserted between the control terminal of said pass gate element and at least a further conduction line.

8. The decoupling circuit of claim 7, wherein said first portion comprises a first protection transistor inserted between a supply voltage reference and at least one internal conduction line and having its control terminal connected to the control terminal of said pass gate element, and said second portion comprises a second protection transistor having conduction terminals connected to the control terminal of said pass gate element and connected to said further conduction line and having a control terminal connected to a ground reference.

9. The decoupling circuit of claim 8, wherein said first portion further comprises an additional protection transistor having its conduction terminals connected to said at least one conduction line and said internal conduction line and having a control terminal connected to the control terminal of said pass gate element.

10. The decoupling circuit of claim 9, wherein the threshold voltage value of said additional protection transistor of said first portion is equal to a threshold voltage value of said pass gate element.

11. A decoupling circuit comprising:
a conduction transistor having first and second conduction terminals coupled to first and second conduction lines, respectively, and a control terminal coupled to an output of an inverter; and
a protection circuit coupled between the second conduction line and the second conduction terminal and further coupled to the output of the inverter, the protection circuit comprising a pull-up transistor having a first terminal coupled to a voltage source, a second terminal coupled to the second conduction terminal of the decoupling transistor, and a control terminal coupled to the output of the inverter, the pull-up transistor configured to prevent a disturbing signal from passing directly from the first conduction line to the second conduction line.

12. The circuit of claim 11, wherein the protection circuit further comprises a pass-gate transistor having a first terminal coupled to the second terminal of the pull-up transistor and to the second conduction terminal of the decoupling transistor, and a second terminal coupled to the second conduction line, and a control terminal coupled to the output of the inverter.

13. The circuit of claim 12, wherein the pull-up transistor is a PMOS transistor and the pass-gate transistor comprises an NMOS transistor, and further wherein the decoupling transistor comprises an NMOS transistor.

14. A decoupling circuit, comprising:
a decoupling transistor having first and second conduction terminals coupled to first and second conduction lines, respectively, and a control terminal coupled to an output of an inverter; and
a protection circuit having a first terminal coupled to the first conduction line and a second terminal coupled to the output of the inverter, the protection circuit configured to be in an "off" condition when the voltage on the first conduction line is higher than a ground reference potential to permit the decoupling transistor to be driven directly from the inverter, and the protection circuit further configured to have the voltage at the control terminal of the decoupling transistor follow the voltage on the first conduction line when the voltage on the first conduction line falls below the ground reference potential.

15. The circuit of claim 14, wherein the protection circuit comprises a protection transistor having a first terminal coupled to the first conduction line, a second terminal coupled to the output of the inverter, and a control terminal coupled to the ground reference potential.

16. The circuit of claim 15, wherein the protection transistor has a threshold voltage that is lower than a threshold voltage of the decoupling transistor.

17. A decoupling circuit, comprising:
a decoupling transistor having first and second conduction terminals coupled to first and second conduction lines, respectively, and a control terminal coupled to an output of an inverter;
a first protection circuit comprising:
a protection circuit coupled between the second conduction line and the second conduction terminal of the decoupling transistor and further coupled to the output of the inverter, the protection circuit comprising a pull-up transistor having a first terminal coupled to a voltage source, a second terminal coupled to the second conduction terminal of the decoupling transistor, and a control terminal coupled to the output of the inverter, the pull-up transistor configured to prevent a disturbing signal from passing directly from the first conduction line to the second conduction line;
a second protection circuit having a first terminal coupled to the first conduction line and a second terminal coupled to the output of the inverter, the protection circuit configured to be in an "off" condition when the voltage on the first conduction line is higher than a ground reference potential to permit the decoupling transistor to be driven directly from the inverter, and the protection circuit further configured to have the voltage at the control terminal of the decoupling transistor follow the voltage on the first conduction line when the voltage on the first conduction line falls below the ground reference potential.

18. The circuit of claim 17, wherein the first protection circuit further comprises:
a pass-gate transistor having a first terminal coupled to the second terminal of the pull-up transistor and to the second conduction terminal of the decoupling transistor, and a second terminal coupled to the second conduction line, and a control terminal coupled to the output of the inverter.

19. The circuit of claim 17, wherein the second protection circuit comprises:
a protection transistor having a first terminal coupled to the first conduction line, a second terminal coupled to the output of the inverter, and a control terminal coupled to the ground reference potential.

20. The circuit of claim 19, wherein the protection transistor has a threshold voltage lower than a threshold voltage of the decoupling transistor.

* * * * *